United States Patent [19]

Amann et al.

[11] Patent Number: 4,907,068

[45] Date of Patent: Mar. 6, 1990

[54] SEMICONDUCTOR ARRANGEMENT HAVING AT LEAST ONE SEMICONDUCTOR BODY

[75] Inventors: Heinz Amann, Unterhaching; Leo Lorenz, Neubiberg, both of Fed. Rep. of Germany

[73] Assignee: Siemens Aktiengesellschaft, Berlin and Munich, Fed. Rep. of Germany

[21] Appl. No.: 137,607

[22] Filed: Dec. 24, 1987

[30] Foreign Application Priority Data

Jan. 21, 1987 [DE] Fed. Rep. of Germany ....... 3701650

[51] Int. Cl.$^4$ ............................................. H01L 23/48
[52] U.S. Cl. ........................................ 357/74; 357/68; 357/80; 357/75; 357/71; 357/72
[58] Field of Search ...................... 357/68, 80, 74, 75, 357/71, 72

[56] References Cited

U.S. PATENT DOCUMENTS

| | | | |
|---|---|---|---|
| 4,213,141 | 7/1980 | Colussi | 357/74 |
| 4,237,522 | 12/1980 | Thompson | 361/392 |
| 4,825,279 | 4/1989 | Furuhata | 357/68 |

FOREIGN PATENT DOCUMENTS

| | | | |
|---|---|---|---|
| 0042987 | 1/1982 | European Pat. Off. | |
| 3516995 | 11/1985 | Fed. Rep. of Germany | |
| 57-97661 | 6/1982 | Japan | 357/75 |
| 58-181968 | 8/1985 | Japan | |

*Primary Examiner*—Andrew J. James
*Assistant Examiner*—David Soltz
*Attorney, Agent, or Firm*—Hill, Van Santen, Steadman & Simpson

[57] ABSTRACT

In a semiconductor arrangement having at least one semiconductor body located on an insulating substrate provided with interconnects, a low-inductance arrangement can be achieved in that the connecting leads are arranged in close proximity to one another and at least partially parallel to one another.

8 Claims, 2 Drawing Sheets

SEMICONDUCTOR ARRANGEMENT HAVING AT LEAST ONE SEMICONDUCTOR BODY

BACKGROUND OF THE INVENTION

The invention is directed to a semiconductor arrangement having an insulating substrate of the type having at least two interconnects located on the substrate and electrically separated from one another. At least one semiconductor body is provided with contacts, and electrical connections exist between the contacts and the interconnects. Connecting leads are provided, one of which is electrically connected to one of the two interconnects.

A semiconductor arrangement of the described type is the subject matter of an earlier German patent application P 36 35 956.4. One exemplary embodiment shows that the connecting leads carrying the load current are arranged at opposite ends of the substrate. They thus form a relatively high inductance in the load circuit, whereby a high voltage that can lead to the destruction of the semiconductor components is induced when the semiconductor arrangement is shut off with a high level of load current.

SUMMARY OF THE INVENTION

An object of the present invention is to reduce the inductance of the main circuitry. This object is achieved in that connecting leads are arranged in close proximity and at least partially parallel to one another. A semiconductor arrangement has an insulating substrate on a surface of which are located two interconnects which are electrically separated from one another. A semiconductor body provided with contacts is located on one of the interconnects and electrical connections are provided between the contacts and the other interconnect. Connecting leads are connected to the two interconnects. These connecting leads are located in close proximity and are at least partially parallel to one another.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several FIGS. of which like reference numerals identify like elements, and in which:

DESCRIPTION OF THE PREFERRED EMBODIMENT

Figure 1:
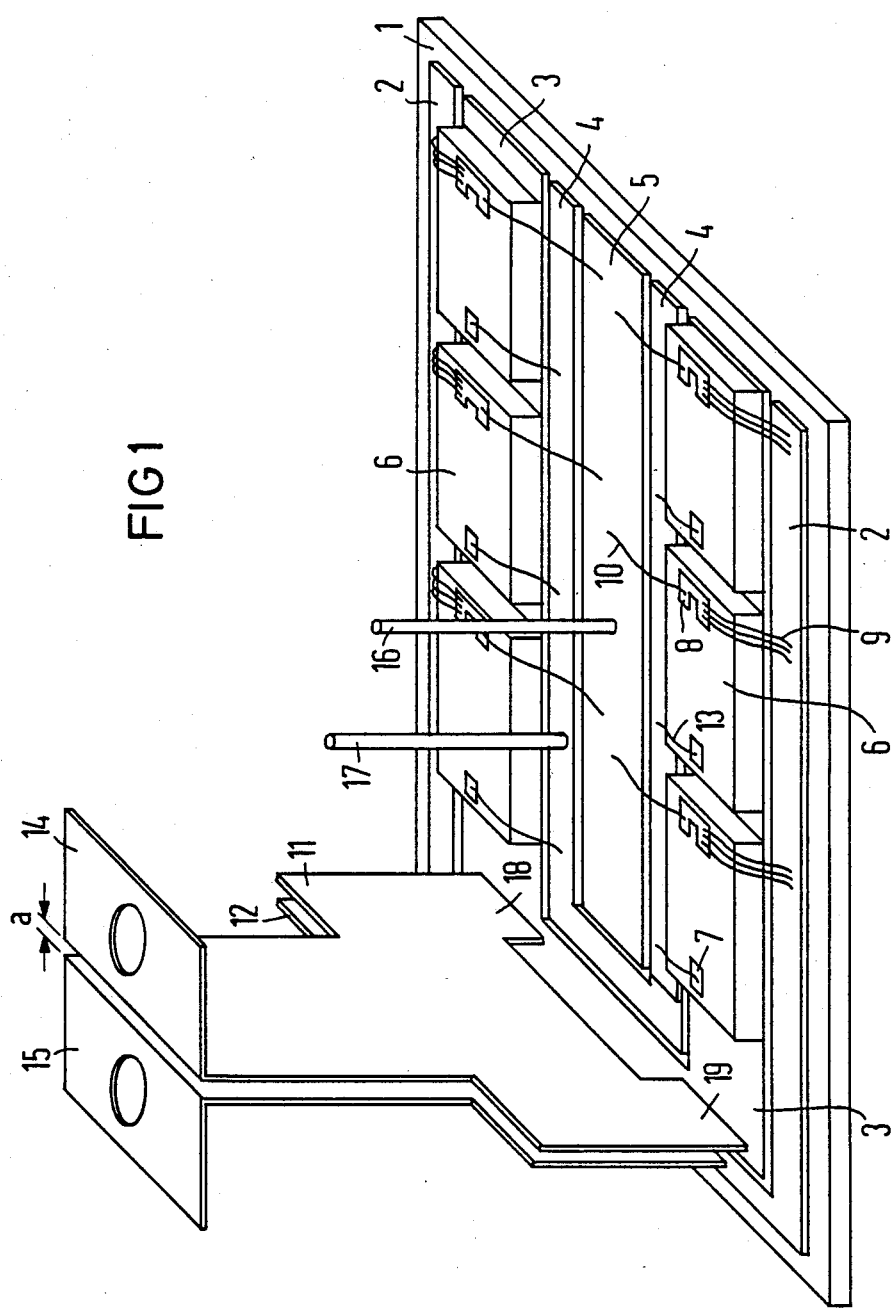
FIG. 1 is a perspective view of a first embodiment.

The semiconductor arrangement of FIG. 1 is constructed on a substrate 1. The substrate 1 is composed of a material having good insulating properties and good thermal conduction such as, for example, aluminum oxide or beryllium oxide. Interconnects 2, 3, 4 and 5 are arranged on the substrate. The interconnects 2 and 3 are fashioned U-shaped and are connected are interleaved in one another. Semiconductor bodies 6 are arranged on the interconnect 3 and are connected to the interconnects in current-conducting fashion. For example, the semiconductor bodies can be power MOSFETs or bipolar transistors. It is assumed in the present case that the semiconductor bodies 6 are MOSFETs. They have gate contacts 7 and source contacts 8 on a side facing away from the interconnect 3. A drain contact is located on an underside and is connected to the interconnect 3. The source contacts 7 are connected to the interconnect 4 via bonding wires 13. The source contacts 8 are connected to the interconnect 2 via bonding wires 9 and are also connected to the interconnect 5 via bonding wires 10.

To provide an optimally low inductance in the load circuit, the interconnects 2 and 3 are arranged close to one another. Their spacing, however, is dimensioned such that the required electric isolation is maintained. The interconnects 2 and 3 also lie parallel to one another. A respective connecting lead 11 and 12 is attached, for example, by soldering, to the yokes of the two U-shaped interconnects 2 and 3 which likewise lie parallel to one another. The connecting leads 11, 12 are parallel to one another except for their areas 14, 15 intended for connection to an external line. Their spacing "a", like the spacing between the two interconnects 2 and 3, is selected optimally small but such that electric isolation is still maintained.

On the basis of the described structure, the inductance of the main circuitry is approximately half of that of the initially cited prior art semiconductor arrangement. The inductance voltage appearing when the current is shut off is thus also half of the current appearing in prior art semiconductor arrangements.

The interconnects 4 and 5 are connected to a gate terminal 17 and to an auxiliary source terminal 16, respectively. The MOSFETs 6 are controlled by a voltage applied between the terminals 6 and 17. The control circuit is thus largely inductively decoupled from the load circuit, so that the rise in load current only has a slight influence on the turn-on behavior of the semiconductor arrangement.

The inductance existing despite the slight distance "a" between the connecting leads 11, 12 can be partially compensated for by filling the space between the connecting leads 11, 12 with a dielectric whose relative dielectric constant is greater than 1. Materials used for capacitors can be utilized for this purpose. Additionally or exclusively, an insulator foil can be arranged between the two connecting leads.

It is recommendable that the connecting leads be as short as possible to provide of a low inductance. They therefore preferably reside perpendicular to the surface of the substrate 1.

Figure 2:
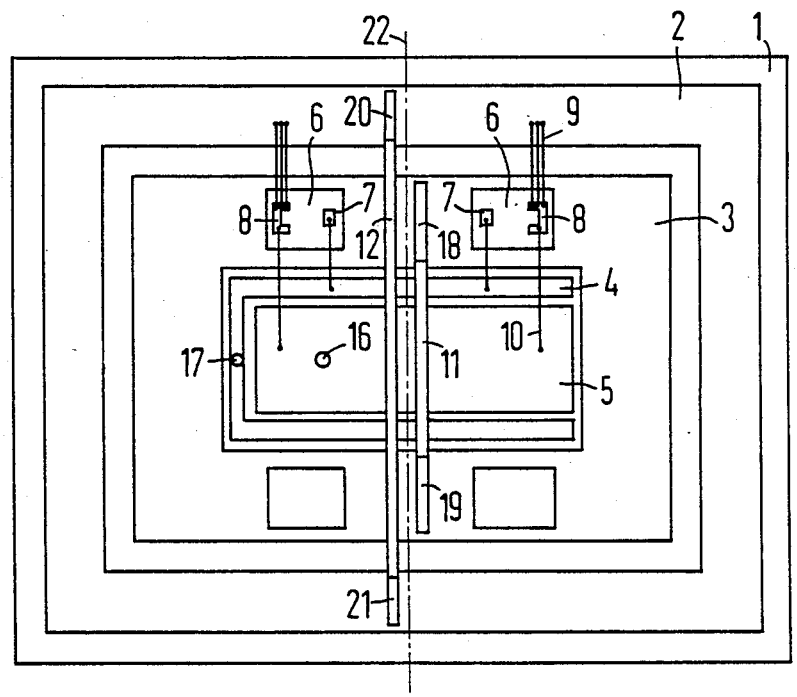
FIG. 2 is a plan view of a second embodiment.

When the semiconductor arrangement has a plurality of semiconductor bodies, then the connecting leads 11, 12 can be arranged symmetrically on the substrate 1 and on the interconnects 2, 3, as shown in FIG. 2. In the exemplary embodiment of FIG. 2, the interconnects 2, 3 are self-contained rings which are respectively fashioned with mirror-image symmetry relative to an axis 22. Likewise, the semiconductor bodies 6 are distributed on the interconnect 3 symmetrically relative to the axis 22. The connecting leads 11, 12 are located on opposed sides of the axis 22 of symmetry. In order to avoid shorts, the connecting leads 11, 12 have feet 18, 19 and 20, 21, respectively. With respect to the position of the contacts 7 and 8, the semiconductor bodies 6 can likewise be located symmetrically on the interconnect 3 relative to the axis 22

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A semiconductor arrangement comprising: at least first, second, third and fourth parallel electrically separated interconnects arranged on one and the same surface of a substrate; on the first interconnect a plurality of semiconductor bodies being arranged in a row and each semiconductor body being electrically connected to the first interconnect by a first contact; each of the semiconductor bodies having a second contact and a third contact, the second contacts being connected by first wires to the second interconnect and by second wires to the third interconnect, the third contacts being connected by third wires to the fourth interconnect, a first connecting lead and a second connecting lead being secured to portions of the first interconnect and the second interconnect, respectively, which lie adjacent to one another and parallel to one another; the first and second connecting leads located in close proximity, and at least partially parallel to one another, the first and second connecting leads being positioned at a right angle to the substrate surface; the third interconnect and the fourth interconnect connected to a first terminal and a second terminal, respectively.

2. The semiconductor arrangement according to claim 1, wherein the first and second interconnects of the first, second, third and fourth interconnects are each fashioned mirror-image symmetrical; wherein the semiconductor bodies are located on the second interconnect with symmetrically distribution; and wherein the connecting leads are connected to the corresponding interconnects on opposed sides of an axis of symmetry.

3. The semiconductor arrangement according to claim 1, wherein a space between the two connecting leads is filled with a dielectric which has a relative dielectric constant greater than one.

4. The semiconductor arrangement according to claim 3, wherein an insulator foil is arranged between the two connecting leads.

5. A semiconductor arrangement comprising: an insulating substrate;
at least first, second, third and fourth parallel interconnects arranged on a same surface of the substrate and electrically separated from one another; a plurality of semiconductor bodies each having at least first, second and third contacts and located in a row on the first interconnect, the second contacts electrically connected to the second interconnect and to the third interconnect, and the third contacts electrically connected to the fourth interconnect, the semiconductor bodies being electrically connected to the first interconnect by the first contact;
at least first and second connecting leads secured to the first and second interconnects, respectively, the connecting leads located in close proximity and at least partially parallel to one another, the two interconnects being parallel to one another and the connecting leads being secured to portions of the interconnects which lie adjacent and parallel to one another, the connecting leads being positioned at substantially a right angle to the surface of the substrate;
the third interconnect and the fourth interconnect connected to a first terminal and a second terminal, respectively.

6. A semiconductor arrangement according to claim 5, wherein the first and second interconnects are configured with mirror-image symmetry about an axis of symmetry on the surface of the substrate, the plurality of semiconductor bodies located on the first interconnect arranged symmetrically thereon about the axis of symmetry, and wherein the first and second connecting leads are connected to the corresponding first and second interconnects on opposed sides of the axis of symmetry.

7. A semiconductor arrangement according to claim 5, wherein a space between the two connecting leads is filled with a dielectric which has a relative dielectric constant greater than one.

8. A semiconductor arrangement according to claim 7, wherein an insulator foil is arranged between the two connecting leads.

* * * * *